United States Patent
Miyano

(10) Patent No.: US 7,148,130 B2
(45) Date of Patent: Dec. 12, 2006

(54) SEMICONDUCTOR DEVICE AND METHOD OF MANUFACTURING THE SAME

(75) Inventor: Kiyotaka Miyano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/706,034

(22) Filed: Nov. 13, 2003

(65) Prior Publication Data

US 2004/0124476 A1 Jul. 1, 2004

(30) Foreign Application Priority Data

Nov. 14, 2002 (JP) .............................. 2002-330399

(51) Int. Cl.
  *H01L 21/20* (2006.01)
(52) U.S. Cl. ...................... 438/509; 438/590; 438/795; 438/933
(58) Field of Classification Search ................ 438/478, 438/479, 509, 795, 933
  See application file for complete search history.

(56) References Cited

U.S. PATENT DOCUMENTS

| | | | |
|---|---|---|---|
| 4,920,076 A * | 4/1990 | Holland et al. ............. | 438/766 |
| 5,516,724 A * | 5/1996 | Ast et al. .................... | 438/541 |
| 6,130,144 A * | 10/2000 | Verret ......................... | 438/542 |
| 6,133,150 A | 10/2000 | Nakajima et al. | |
| 6,518,197 B1 * | 2/2003 | Hirose ........................ | 438/749 |
| 6,579,805 B1 * | 6/2003 | Bar-Gadda .................. | 438/710 |
| 6,762,468 B1 * | 7/2004 | Ohuchi ....................... | 257/407 |

FOREIGN PATENT DOCUMENTS

| | | |
|---|---|---|
| JP | 9-45903 | 2/1997 |
| JP | 2002-26318 | 1/2002 |

OTHER PUBLICATIONS

Notification of Reasons for Rejection mailed Mar. 28, 2006, issued by the Japanese Patent Office in counterpart Japanese Application No. 2002-330399 and English translation thereof.

* cited by examiner

*Primary Examiner*—Trung Dang
(74) *Attorney, Agent, or Firm*—Finnegan, Henderson, Farabow, Garrett & Dunner, L.L.P.

(57) ABSTRACT

A semiconductor device is disclosed, which comprises a semiconductor substrate, source/drain regions formed in the semiconductor substrate, a gate insulating film formed on a channel region between the source/drain regions, a gate electrode formed on the gate insulating film, and a sidewall insulating film formed on a sidewall surface of the gate electrode, wherein the gate electrode is made of SiGe, the sidewall insulating film is an insulating film obtained by oxidizing the sidewall surface of the gate electrode, and the sidewall insulating film contains silicon oxide as a main component.

12 Claims, 7 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-330399, filed Nov. 14, 2002, the entire contents of which are incorporated herein by reference.

BACKGROUND OF THE INVENTION

1. Field of the Invention

This invention relates generally to a semiconductor device and a method of manufacturing the same, and more specifically to a structure of a MOS transistor using two types of semiconductors as conductive layer materials, such as Si and Ge (SiGe).

2. Description of the Related Art

Using SiGe as a conductive layer material for high performance MOS transistors has been a great deal of attention.

For example, as shown in FIG. 25, SiGe is used as a gate electrode material to improve the activation efficiency of a PMOS transistor and to thereby suppress depletion. Generally, an oxide film (sidewall oxide film) of about several nm to 10 nm is formed on sidewalls of a gate electrode. Principally, the sidewall oxide film of the gate electrode is formed to eliminate damage introduced to gate edge regions of the semiconductor substrate side through mainly RIE (reactive ion etching) in the gate electrode processing. The sidewall oxide film of the gate electrode concurrently serves as a barrier layer that suppresses dopants being diffused out from the gate electrode ("out-diffusion" of dopants) during a heat treatment such as activation annealing in a later performed process.

In a MOS transistor in the generation that uses SiGe for a gate electrode, the gate electrode is required to contain carriers at a high-concentration to suppress the gate depletion. As such, the prevention of out-diffusion of dopant from the gate electrode becomes more important.

In addition, in a small-size MOS transistor, a gate-electrode sidewall oxide film is used as a spacer for providing offsets between the gate electrode and an ion-implantation region when performing ion implantation to suppress a short channel effect. Use of a SiGe film for a gate electrode is described in Jpn. Pat. Appln. KOKAI Publication No. 2002-26318 (FIG. 1, pp. 2 to 3). Meanwhile, SiGe is not a compound, but is a mixed crystal; and it is formerly represented as "$Si_{1-x}Ge_x$".

Since the SiGe-gate sidewall oxide film is formed by oxidizing a SiGe gate electrode (SiGe), the sidewall oxide film contains $SiO_2$ and $GeO_2$. However, when $SiO_2$ and $GeO_2$ formed by oxidizing SiGe are compared with each other, $GeO_2$ is lower than $SiO_2$ in chemical resistance to $H_2O_2$, $H_2SO_4$, and HF, for example, and is higher in volatility than $SiO_2$. Because of these characteristics, the sidewall oxide film is damaged by processes such as chemical and heat treatments performed after formation of the gate oxide film, and the film becomes a coarse film. As a result, the resistance to the out-diffusion of dopants from the gate electrode is significantly reduced, when the film undergoes a heat treatment such as activation annealing in a later performed process. Further, in the sidewall oxide film, thickness uniformity is also reduced, so that the function as the offset spacer between the gate electrode and the ion-implanted region is deteriorated.

As shown in FIG. 26, in the field of MOS transistors, there is a promising technique in which a SiGe film is epitaxially grown to have a SiGe channel layer to enhance the carrier mobility in the channel region. In this case, after the SiGe channel layer is formed, the surface (SiGe) of the SiGe channel layer is oxidized to form a gate oxide film. Since the gate oxide film is thus formed through oxidation of SiGe then the gate oxide film contains $SiO_2$ and $GeO_2$. However, as described above in connection with the sidewall oxide film of the SiGe gate electrode, when $SiO_2$ and $GeO_2$ formed through oxidation of SiGe are compared with each other, $GeO_2$ is found lower to $SiO_2$ in the chemical resistance to $H_2O_2$, $H_2SO_4$, and HF, for example. Concurrently, $GeO_2$ is found higher than $SiO_2$ in volatility. Accordingly, the gate oxide film thus produced is damaged during processes such as chemical and heat treatments performed after the formation of the gate oxide film. This makes the problem more prominent in that the thickness of the gate oxide film is further reduced.

BRIEF SUMMARY OF THE INVENTION

According to an aspect of the present invention, there is provided a semiconductor device comprising:

a semiconductor substrate;

source/drain regions formed in the semiconductor substrate;

a gate insulating film formed on a channel region between the source/drain regions;

a gate electrode formed on the gate insulating film; and a sidewall insulating film formed on a sidewall surface of the gate electrode, wherein the gate electrode is made of SiGe, the sidewall insulating film is an insulating film obtained by oxidizing the sidewall surface of the gate electrode, and the sidewall insulating film contains silicon oxide as a main component.

According to another aspect of the present invention, there is provided a semiconductor device comprising:

a semiconductor substrate in which a SiGe monocrystal layer is formed;

source/drain regions formed in the semiconductor substrate;

a gate insulating film formed on a channel region between the source/drain regions; and a gate electrode formed on the gate insulating film, wherein the channel region is formed of the SiGe monocrystal layer, the gate insulating film is an insulating film obtained by oxidizing a surface of the SiGe monocrystal layer, and the gate insulating film is made of silicon oxide as a main component.

According to a further aspect of the present invention, there is provided a method of manufacturing a semiconductor device, comprising:

forming an insulating film on a semiconductor substrate;

forming a conductive film made of a first semiconductor and a second semiconductor on the insulating film; and thermal-oxidizing the conductive film in an atmosphere that contains an oxidant for oxidizing the first semiconductor and the second semiconductor and a reductant for reducing the first semiconductor and the second semiconductor, to form an oxide film made of the first semiconductor on the conductive film.

According to a further aspect of the present invention, there is provided a semiconductor device comprising:

forming source/drain regions formed in a semiconductor substrate;

forming a gate insulating film on a channel region between the source/drain regions;

forming a gate electrode made of SiGe on the gate insulating film; and thermal-oxidizing the gate electrode in an atmosphere that contains an oxidant for oxidizing Si and a reductant for reducing Ge to form a sidewall insulating film on a sidewall surface of the gate electrode.

According to a further aspect of the present invention, there is provided a method of manufacturing a semiconductor device, comprising:

forming a monocrystal layer made of at least two kinds of semiconductors on a semiconductor substrate; and thermal-oxidizing the monocrystal layer in an atmosphere that contains an oxidant and a reductant as an oxidation seed to form an oxide film made of one of the at least two kinds of semiconductors on a surface of the monocrystal layer.

According to a further aspect of the present invention, there is provided a method of manufacturing a semiconductor device comprising:

forming an SiGe monocrystal layer including a channel region on a semiconductor substrate;

forming source/drain regions in the SiGe monocrystal layer formed on the semiconductor substrate;

forming a gate insulating film on the channel region between the source/drain regions; and forming a gate electrode on the gate insulating film, wherein the gate insulating film is formed on a surface of the SiGe monocrystal layer by thermal-oxidizing the SiGe monocrystal layer in an atmosphere that contains an oxidant for oxidizing Si, and a reductant for reducing Ge, and the gate insulating film is made of substantially silicon oxide.

According to a further aspect of the present invention, there is provided a method of manufacturing a semiconductor device, comprising:

forming a conductive film made of a first semiconductor and a second semiconductor on an insulating film formed on a semiconductor substrate; and thermal-oxidizing the conductive film in an atmosphere in which the first semiconductor is oxidized and the second semiconductor is not oxidized, to form an oxide film made of the first semiconductor on the conductive film.

DETAILED DESCRIPTION OF THE INVENTION

Embodiments of the present invention will be described hereinbelow with reference to the accompanying drawings.

(First Embodiment)

First, a first embodiment of the invention will be described with reference to FIGS. 1 to 13.

In the first embodiment, a conductive film including a first semiconductor and a second semi-conductor is formed over an insulating film formed over a semiconductor substrate. The conductive film then undergoes a heat treatment in an atmosphere that permits the first semiconductor to be oxidized but does not permit the second semiconductor to be oxidized. Consequently, a finely composed oxide film is formed of substantially only the first semiconductor and does not include an oxide of the second semiconductor.

Figure 11:
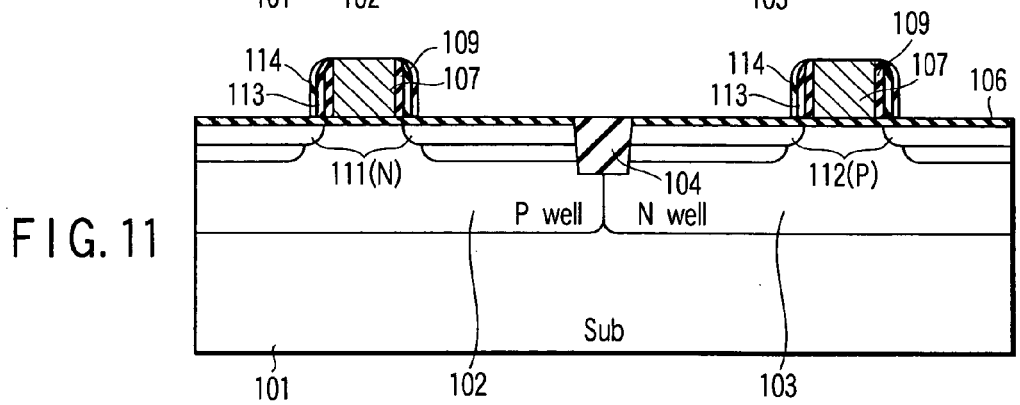
FIG. 11 is a cross sectional view of the complimentary metal oxide semiconductor field effect transistor in a step following the step of FIG. 10 of the manufacturing method according to the first embodiment of the present invention.
Figure 12:
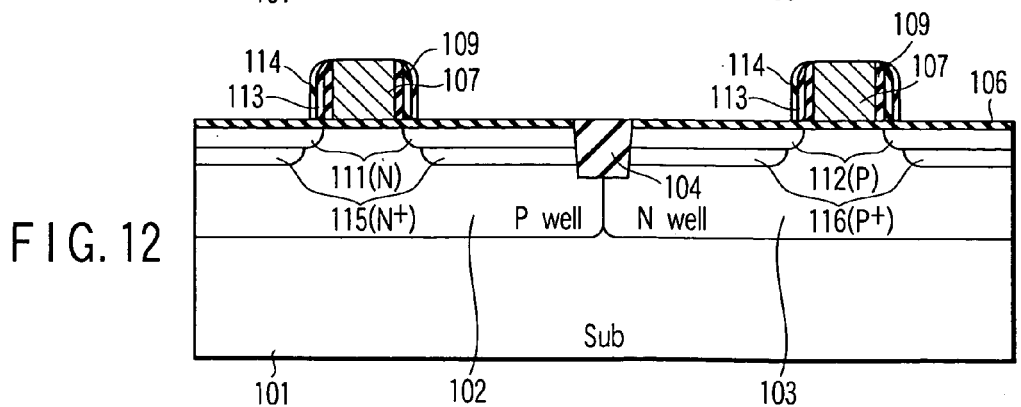
FIG. 12 is a cross sectional view of the complimentary metal oxide semiconductor field effect transistor in a step following the step of FIG. 11 of the manufacturing method according to the first embodiment of the present invention.
Figure 13:
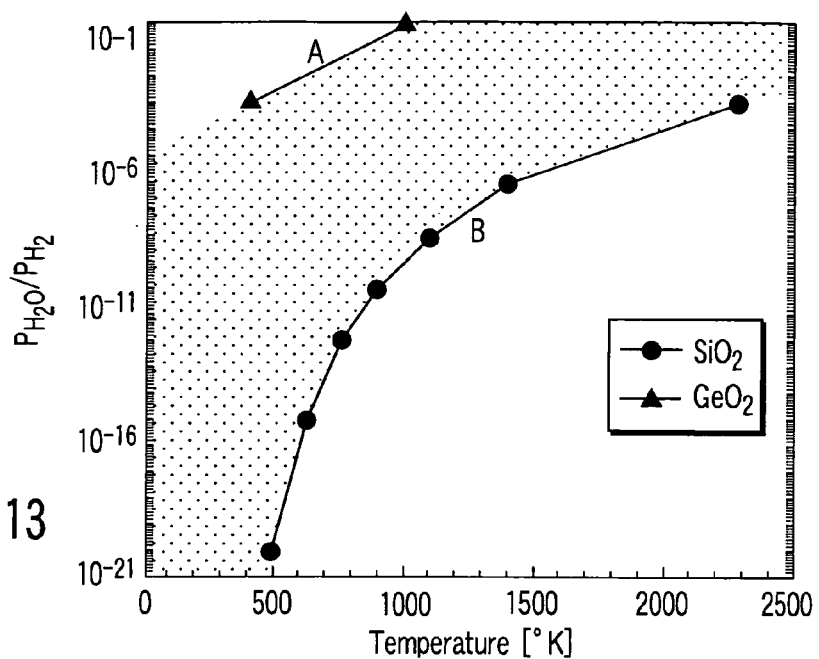
FIG. 13 is a characteristic diagram showing temperature dependency of equilibrium vapor-hydrogen partial pressures of silicon (Si) oxide and germanium (Ge) oxide.

FIGS. 1 to 12 are cross-sectional views of a complimentary metal oxide semiconductor field effect transistor (CMOSFET) in individual steps of a manufacturing method according to a first embodiment of the present invention. FIG. 13 is a characteristic diagram showing temperature dependency of equilibrium vapor-hydrogen partial pressures of silicon (Si) oxide and germanium (Ge) oxide. In this diagram, the vertical axis represents a partial pressure ratio ($P_{H2O}/P_{H2}$) of $H_2O$ to $H_2$, and the horizontal axis represents a heat treatment temperature (absolute temperature) (° K). The diagram depicts a characteristic curve A of equilibrium vapor-hydrogen partial pressure characteristics of $GeO_2$ and a characteristic curve B of equilibrium vapor-hydrogen partial pressure characteristics of $SiO_2$.

Figure 1:
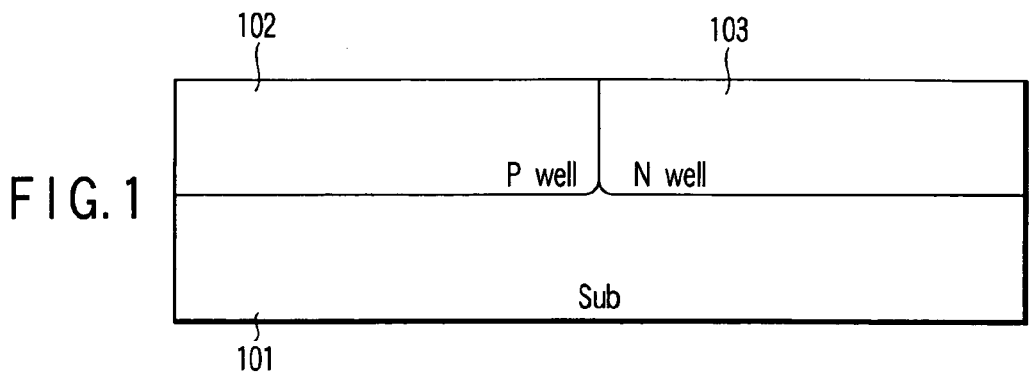
FIG. 1 is a cross sectional view of a complimentary metal oxide semiconductor field effect transistor (CMOSFET) in a step of a manufacturing method according to a first embodiment of the present invention.

A desired resist pattern (not shown) is formed by photolithography in a desired region on a silicon semiconductor substrate 101. Then, using the pattern as a mask, B, Ga, or In is implanted by ion implantation into the semiconductor substrate 101. After the resist pattern is removed, a resist pattern (not shown) is similarly formed by photolithography in a desired region on the silicon semiconductor substrate 101, and then using the pattern as a mask, As, P, or Sb is implanted by ion implantation into the silicon semiconductor substrate 101. Subsequently, thermal diffusion is performed to form a P-type dopant impurity diffused region (P-well) 102 and an N-type impurity dopant diffused region (N-well) 103 both having a depth of about 1 µm from the surface of the substrate (FIG. 1).

Figure 2:
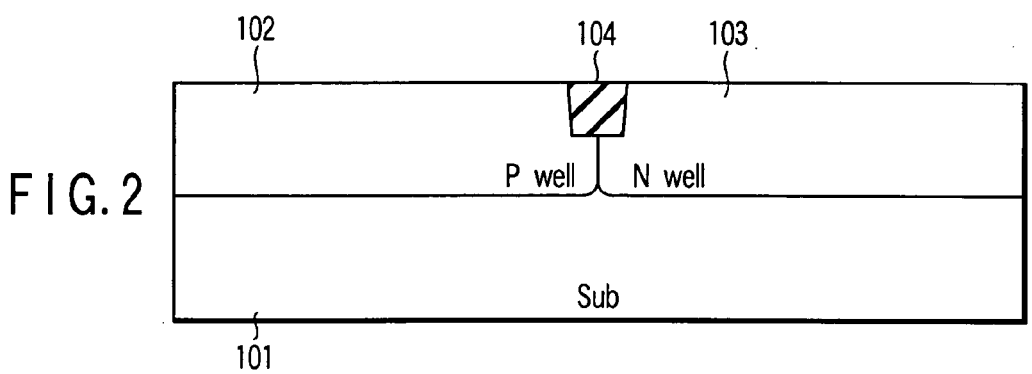
FIG. 2 is a cross sectional view of the complimentary metal oxide semiconductor field effect transistor in a step following the step of FIG. 1 of the manufacturing method according to the first embodiment of the present invention.

Subsequently, using a well-known technique, a trench is formed in a predetermined region (the boundary region between the P-type dopant impurity diffused region 102 and the N-type dopant impurity diffused region 103) on the surface of the semi-conductor substrate 101. Then, a silicon oxide film having a thickness of about 400 nm is embedded by a technique such as CVD (chemical vapor deposition) in that region, and the region is formed to serve as a device isolation region 104 having an STI (shallow trench isolation) structure (FIG. 2).

Figure 3:
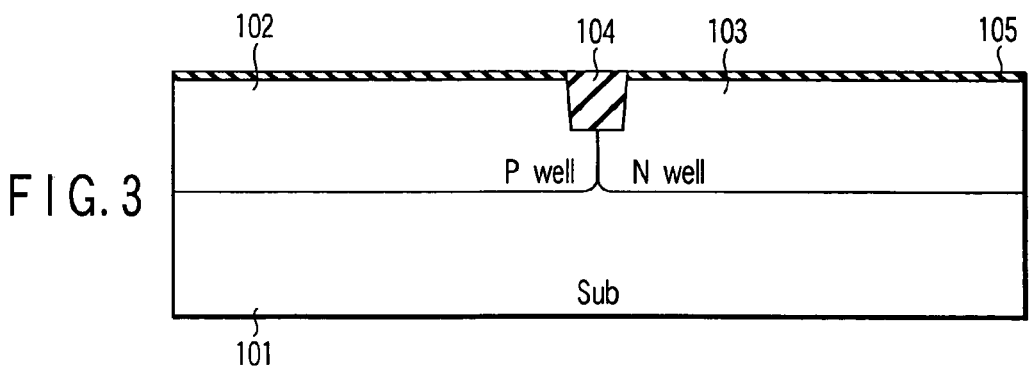
FIG. 3 is a cross sectional view of the complimentary metal oxide semiconductor field effect transistor in a step following the step of FIG. 2 of the manufacturing method according to the first embodiment of the present invention.

Next, a heat treatment is performed, and a silicon oxide film 105 having a thickness of about 10 nm is formed on the overall surface of the substrate. Thereafter, ion implantation is performed into the substrate via the protective oxide film (silicon oxide film) 105 to define a threshold value of the transistor (FIG. 3).

Figure 4:
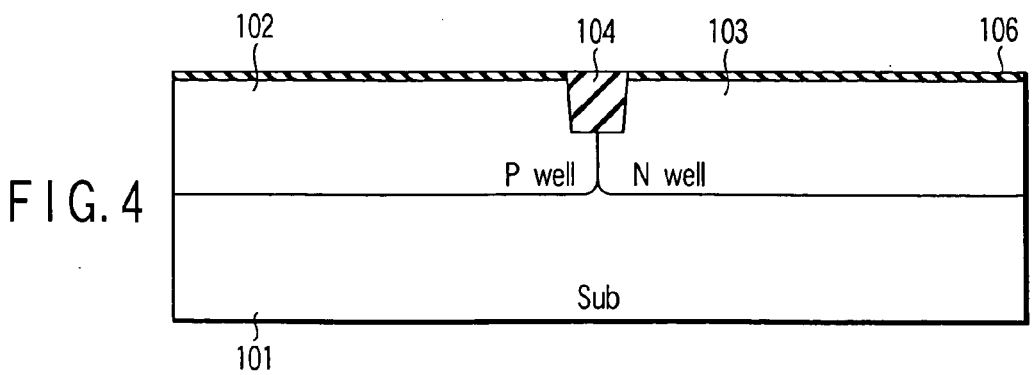
FIG. 4 is a cross sectional view of the complimentary metal oxide semiconductor field effect transistor in a step following the step of FIG. 3 of the manufacturing method according to the first embodiment of the present invention.

Subsequently, the silicon oxide film 105 is removed. Then, for use as a gate insulating film, an insulating film 106 of several nanometers (nm) is formed overall on the substrate surface (FIG. 4). The insulating film 106 is not limited to the silicon oxide ($SiO_2$) film, but may be any one of other high-k films, i.e., other high dielectric constant films, such as, an oxyniteride film, a tantalum oxide ($TaO_x$) film, a zirconia oxide ($ZrO_x$) film, a hafnium oxide film ($HfO_x$), and films of silicates these elements. These insulating films are formed by selective oxidation.

Figure 5:
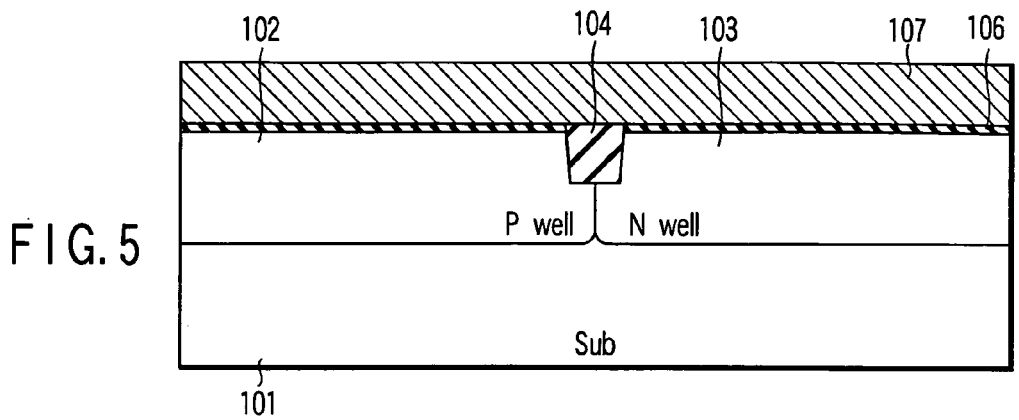
FIG. 5 is a cross sectional view of the complimentary metal oxide semiconductor field effect transistor in a step following the step of FIG. 4 of the manufacturing method according to the first embodiment of the present invention.

Then, CVD or the like is used to deposit a SiGe film 107 over the gate insulating film 106 to a thickness of about 150 nm. Subsequently, the surface of the P-type impurity dopant diffused region 102 and the surface of the N-type impurity dopant diffused region 103 are doped with, for example, As and B, respectively (FIG. 5). SiGe is not a compound, but is an alloy, and it is restrictly represented as "$Si_{1-x}Ge_x$". Generally, a Ge fraction of SiGe is about 2 to 50 atomic %.

Figure 6:
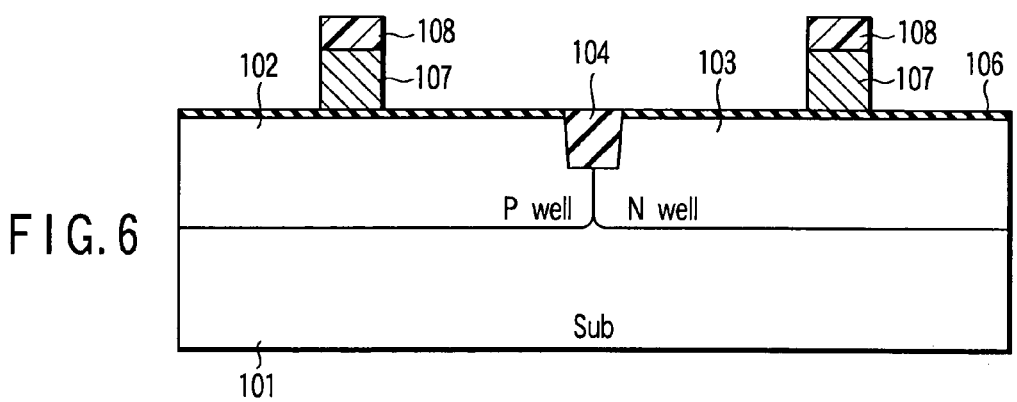
FIG. 6 is a cross sectional view of the complimentary metal oxide semiconductor field effect transistor in a step following the step of FIG. 5 of the manufacturing method according to the first embodiment of the present invention.

Subsequently, a photoresist 108 is coated onto the SiGe film 107, and the photoresist 108 is then patterned. Then, using the patterned photoresist 108 as a mask, the SiGe film 107 is etched, and thus gate electrodes 107 each formed of the SiGe film 107 pattern are formed (FIG. 6).

Subsequently, the photoresist 108 is removed. Thereafter, selective oxidation using $H_2O$ to $H_2$ is performed to form a sidewall oxide film 109 having a thickness of about 2 nm on the sidewalls of the SiGe film 107. The oxide film 109 is thus formed of $SiO_2$ not to contain $GeO_2$. In order to achieve the selective oxidation of the sidewalls of the gate electrode 107 to form the sidewall oxide film 109, the processing uses an atmosphere containing a reductant and an oxidant. For example, the processing uses an atmosphere containing $H_2$ and $H_2O$ or an atmosphere containing CO and $CO_2$. The partial pressure ratio of the oxidant and the reductant is set to a range in which Si is oxidized and Ge is reduced ($P_{H2O}/P_{H2}$ or $P_{CO2}/P_{CO}$), and the selective oxidation is performed at a partial pressure ratio in that range. The range of partial pressure ratios can be obtained from the results of calculations of standard free-energies of formation of $SiO_2$ and $GeO_2$.

Figure 7:
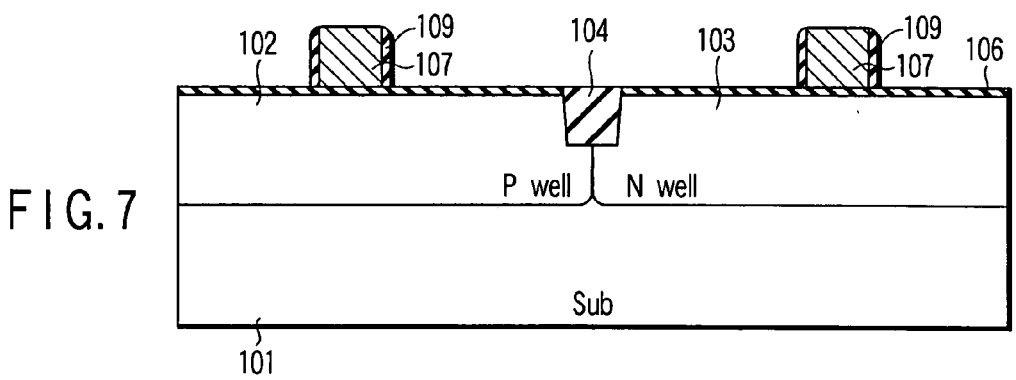
FIG. 7 is a cross sectional view of the complimentary metal oxide semiconductor field effect transistor in a step following the step of FIG. 6 of the manufacturing method according to the first embodiment of the present invention.

FIG. 13 is a characteristic diagram showing the relationship between the partial pressure ratio (equilibrium vapor-hydrogen partial pressure ratio) and the temperature. In this diagram, the vertical axis represents the partial pressure ratio ($P_{H2O}/P_{H2}$) of $H_2O$ to $H_2$, and the horizontal axis represents the heat treatment temperature (absolute temperature) (° K). When performing the selective oxidation for the sidewalls of the gate electrode 107 to form the sidewall oxide film 109, a partial pressure ratio ($P_{H2O}/P_{H2}$) and a temperature (° K) are selected. Specifically, as shown in FIG. 13, the ratio and the temperature are selected from the range between the characteristic curve A of equilibrium vapor-hydrogen partial pressure characteristics of $GeO_2$ and the characteristic curve B of equilibrium vapor-hydrogen partial pressure characteristics of $SiO_2$. This enables the formation of the sidewall oxide film 109 made of $SiO_2$ and not containing $GeO_2$. In more detail, suppose that the selective oxidation is to be performed for the sidewalls of the gate electrode 107 to form the sidewall oxide film 109. In this case, the partial pressure ratio ($P_{H2O}/P_{H2}$) is selected from the range of $10^{-1}$ to $10^{-21}$ between the characteristic curve A of equilibrium vapor-hydrogen partial pressure characteristics of $GeO_2$ and the characteristic curve B of equilibrium vapor-hydrogen partial pressure characteristics of $SiO_2$. Concurrently, the temperature (° K) is selected from the range of from 0° K to 2,500° K between the characteristic curve A of equilibrium vapor-hydrogen partial pressure characteristics of $GeO_2$ and the characteristic curve B of equilibrium vapor-hydrogen partial pressure characteristics of $SiO_2$. Thereby, the sidewall oxide film 109 not containing $GeO_2$ and formed of $SiO_2$ can be formed (FIG. 7).

Figure 8:
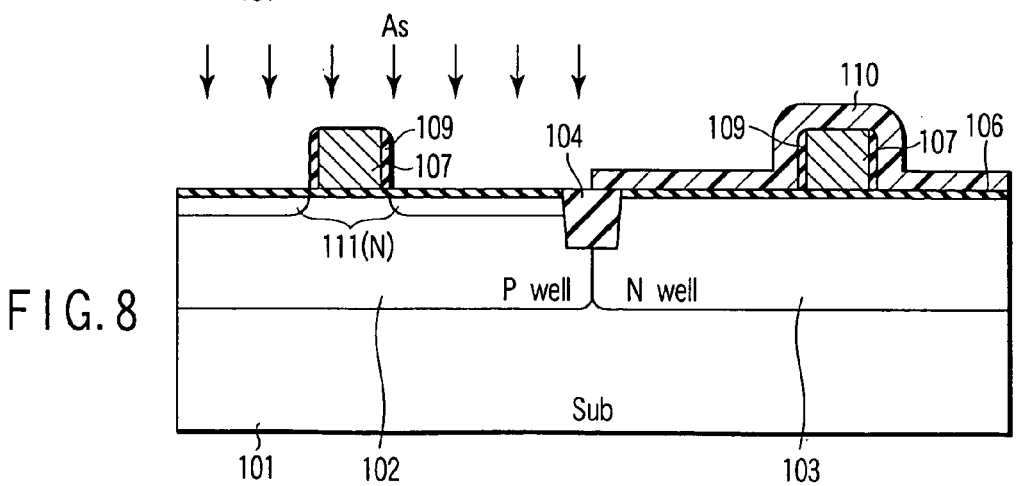
FIG. 8 is a cross sectional view of the complimentary metal oxide semiconductor field effect transistor in a step following the step of FIG. 7 of the manufacturing method according to the first embodiment of the present invention.

As described above, after the sidewall oxide film 109 is formed, the surface of the semiconductor substrate 101 including the gate electrode 107 is coated overall with a photoresist 110, and the photoresist 110 is patterned. Using the patterned photoresist 110 to mask the N-type impurity dopant diffused region 103, the surface of the semiconductor substrate 101 is ion-implanted overall by using As at an energy of about 1 keV and a dose of about 1e15 $cm^{-2}$. Thereby, a shallow N-type dopant impurity diffused region 111 to be used as an LDD (lightly doped drain) region is formed in a surface region of the P-type dopant impurity diffused region 102 (P-well) (FIG. 8).

Figure 9:
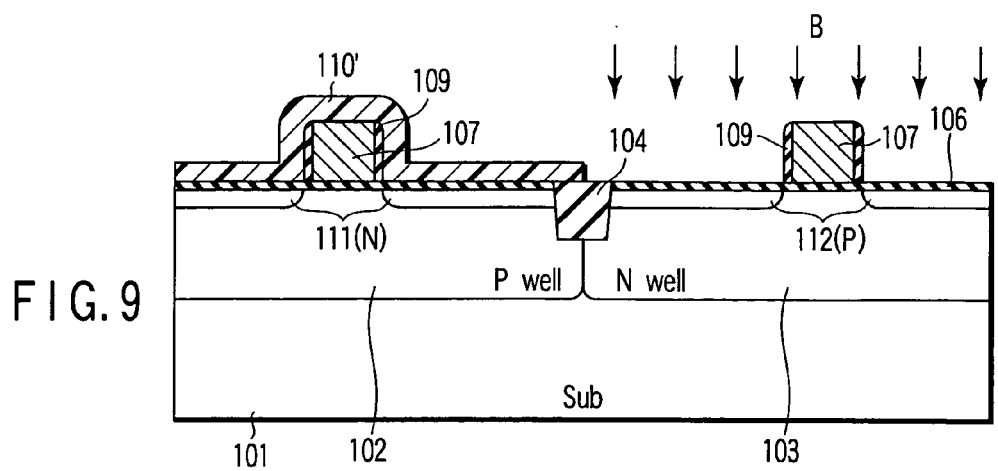
FIG. 9 is a cross sectional view of the complimentary metal oxide semiconductor field effect transistor in a step following the step of FIG. 8 of the manufacturing method according to the first embodiment of the present invention.

Similarly, after the photoresist 110 is removed, a patterned photoresist 110' is formed. Then, using the photoresist 110' to mask the P-type impurity dopant diffused region 102, the surface of the semiconductor substrate 101 is ion-implanted overall by using $BF_2$ at an energy of about 1.5 keV, and a dose of about 1e15 $cm^{-2}$. Thereby, a shallow P-type dopant impurity diffused region 112 to be used as an LDD region is formed in a surface region of the N-type impurity dopant diffused region (N-well) 103 (FIG. 9).

Figure 10:
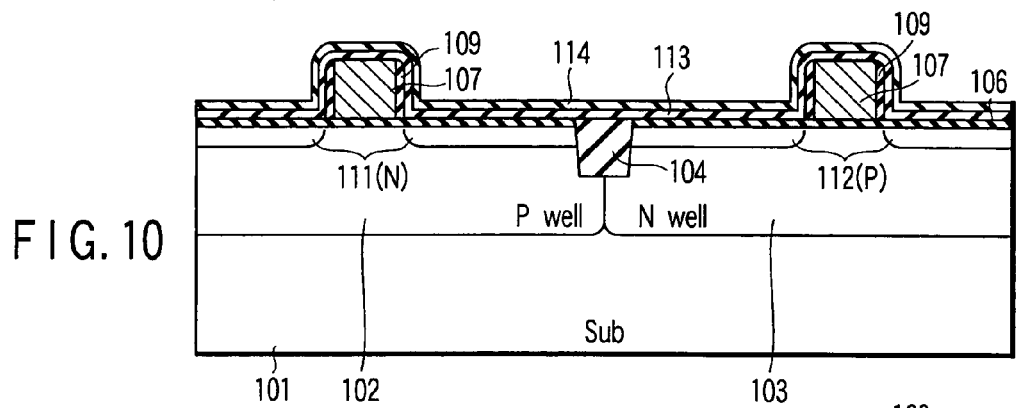
FIG. 10 is a cross sectional view of the complimentary metal oxide semiconductor field effect transistor in a step following the step of FIG. 9 of the manufacturing method according to the first embodiment of the present invention.

After removal of the photoresist 110', a silicon oxide ($SiO_2$) film 113 having a thickness of about 20 nm is deposited with good coverage to the overall surface of the semiconductor substrate 101, which is inclusive of the gate electrode 107, by using CVD (chemical vapor deposition) using TEOS (tetraethoxysilane). Subsequently, a silicon nitride (SiN) film 114 having a thickness of about 20 nm is deposited by CVD with good coverage over the silicon oxide ($SiO_2$) film 113 (FIG. 10).

Subsequently, the deposited silicon oxide film 113 and silicon nitride film 114 are anisotropically etched by a process such as RIE (reactive ion etching). In this case, the etching is performed so that the multilayer film of the silicon oxide film 113 and the silicon nitride film 114 remains on the side wall of the gate electrodes. This consequently enables obtaining a SiGe gate electrode coated with the oxide film ($SiO_2$ film) 109, the silicon oxide film 113 and the silicon nitride film 114 (FIG. 11).

Subsequently, using a photoresist (not shown) to mask the N-type dopant impurity diffused region 103, the P-type dopant impurity diffused region 102 is ion-implanted using P (phosphorus) at an energy of about 10 keV and a dose of about 3e15 $cm^{-2}$. Similarly, using a photoresist (not shown) to mask the P-type dopant impurity diffused region 102, the N-type dopant impurity diffused region 103 is ion-implanted using B at an energy of about 5 keV and a dose of about 3e15 $cm^{-2}$. In these ion implantations, the ions are implanted not only into the dopant impurity diffused regions but also into the gate electrodes. Subsequently, activation annealing is performed at about 1,050° C. for about 10 seconds in an $N_2$ atmosphere. Thereby, an N-type high concentration dopant impurity diffused region 115 is formed below the shallow N-type dopant impurity diffused region 111, and a P-type high concentration dopant impurity diffused region 116 is formed below the shallow P-type dopant impurity diffused region 112. The shallow N-type dopant impurity diffused region 111 and the N-type high concentration dopant impurity diffused region 115 are used to form source/drain regions of the transistor that is to be formed in the P-type dopant impurity diffused region (P-well) 102. Similarly, the shallow P-type dopant impurity diffused region 112 and the P-type high concentration dopant impurity diffused region 116 are used to form source/drain regions of the transistor that is to be formed in the N-type dopant impurity diffused region (N-well) 103 (FIG. 12).

In the case of the sidewall oxide film formed by the conventional sidewalls oxidation technique (non-selective oxidation), the out-diffusion of the dopant from the SiGe gate electrodes cannot be sufficiently suppressed in the activation annealing. This makes it difficult to implement a desired carrier concentration with the SiGe gate electrode. However, according to the embodiment, since the sidewall oxide film 109 is formed by the selective oxidation that forms $SiO_2$ but does not form $GeO_2$, the sidewall oxide film 109 containing no $GeO_2$ and made of $SiO_2$ is formed. As such, the sidewall oxide film 109 is formed to have finely composed film property. This improves out-diffusion suppression effects for the dopant from the SiGe gate electrode by the sidewall oxide film 109. Accordingly, carriers can be maintained at high-concentration with the gate electrode, and consequently, depletion of the gate can be prevented.

In subsequent steps, contacts, wirings, and the like components are formed using well-known processes to complete the semiconductor device. In these steps, salicides of, for example, Ni or Pt, and/or elevated source/drain regions and the like may be formed.

(Second Embodiment)

A second embodiment of the present invention will be described with reference to FIGS. 13 to 24.

As referred to in the first embodiment, FIG. 13 is a characteristic diagram showing temperature dependency of equilibrium vapor-hydrogen partial pressures of silicon (Si) oxide and germanium (Ge) oxide. In this diagram, the vertical axis represents a partial pressure ratio ($P_{H2O}/P_{H2}$) of $H_2O$ to $H_2$, and the horizontal axis represents a heat treatment temperature (absolute temperature) (° K). The diagram depicts a characteristic curve A of equilibrium vapor-hydrogen partial pressure characteristics of $GeO_2$ and a characteristic curve B of equilibrium vapor-hydrogen partial pressure characteristics of $SiO_2$.

FIGS. 14 to 24 are cross-sectional views of a p-type MOS field effect transistor (PMOSFET) in individual steps of a manufacturing method according to the second embodiment of the invention.

Figure 14:
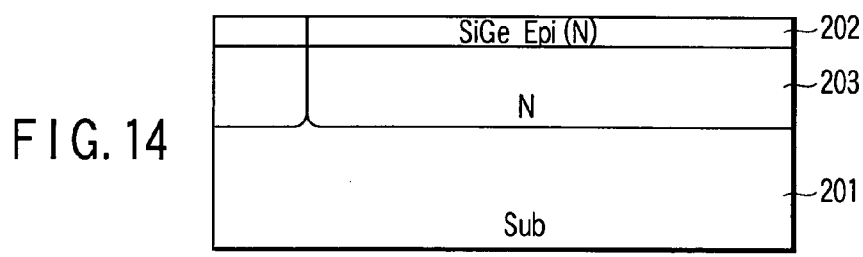
FIG. 14 is a cross sectional view of a p-type MOS field effect transistor (PMOSFET) in a step of a manufacturing method according to a second embodiment of the present invention.

First, a SiGe epitaxial layer 202 is epitaxially grown over the surface of a silicon semiconductor substrate 201. A desired resist pattern (not shown) is formed by photolithography in a desired region on the silicon semiconductor substrate 101, specifically, the SiGe epitaxial layer 202. Then, using the pattern as a mask, As, P, or Sb is implanted by ion implantation into the SiGe epitaxial layer 202. Subsequently, thermal diffusion is performed to form in the SiGe epitaxial layer 202 an N-type dopant impurity diffused region 203 having a depth of about 1 µm from the surface of the substrate (FIG. 14).

Figure 15:
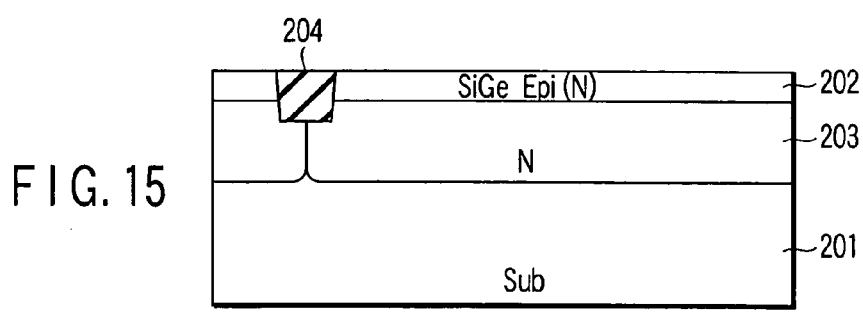
FIG. 15 is a cross sectional view of the p-type MOS field effect transistor in a step following the step of FIG. 14 of the manufacturing method according to the second embodiment of the present invention.

Subsequently, using a well-known technique, a trench is formed in a predetermined region of the surface of the semiconductor substrate thus formed. Then, a silicon oxide film having a thickness of about 400 nm is embedded by a technique such as CVD (chemical vapor deposition) in that region, and the region is formed to serve as a device isolation region 204 having an STI structure (FIG. 15).

Figure 16:
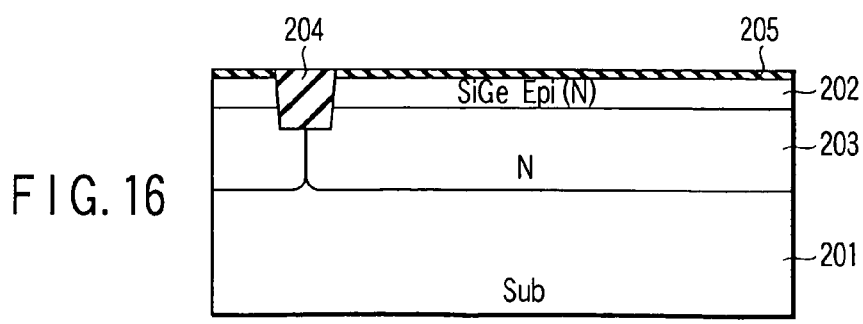
FIG. 16 is a cross sectional view of the p-type MOS field effect transistor in a step following the step of FIG. 15 of the manufacturing method according to the second embodiment of the present invention.

Next, a heat treatment is performed, and a silicon oxide film 205 having a thickness of about 10 nm is formed on the overall surface of the N-type dopant impurity diffused region 203. Thereafter, ion implantation is performed into the N-type dopant impurity diffused region 203 via the protective oxide film (silicon oxide film) 205 to define a threshold value of the transistor (FIG. 16).

Figure 17:
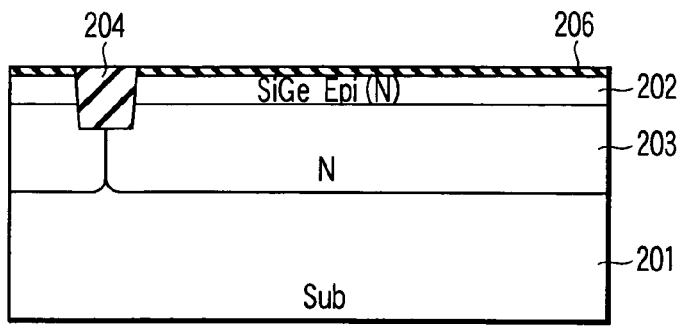
FIG. 17 is a cross sectional view of the p-type MOS field effect transistor in a step following the step of FIG. 16 of the manufacturing method according to the second embodiment of the present invention.

Subsequently, the silicon oxide film 205 is removed. Then, a gate insulating film 206 of several nanometers (nm) formed of $SiO_2$ not to contain $GeO_2$ is formed overall on the N-type dopant impurity diffused region 203, by selective-oxidizing the surface of the N-type dopant impurity diffused region 203 (FIG. 17).

In order to achieve the selective oxidation of the surface of the N-type dopant impurity diffused region 203 to form the gate insulating film 206, the processing uses an atmosphere containing a reductant and an oxidant. For example, the processing uses an atmosphere containing $H_2$ and $H_2O$ or an atmosphere containing $CO$ and $CO_2$. The partial pressure ratio of the oxidant and the reductant is set to a range in which Si is oxidized and Ge is reduced ($P_{H2O}/P_{H2}$ or $P_{CO2}/P_{CO}$), and the selective oxidation is performed at a partial pressure ratio in that range. The range of partial pressure ratios can be obtained from the results of calculations of standard free-energies of formation of $SiO_2$ and $GeO_2$.

The characteristic diagram of FIG. 13 shows the relationship between the partial pressure ratio (equilibrium vapor-hydrogen partial pressure ratio) and the temperature. In this diagram, the vertical axis represents the partial pressure ratio ($P_{H2O}/P_{H2}$) of $H_2O$ to $H_2$, and the horizontal axis represents the heat treatment temperature (absolute temperature) (° K). When performing the selective oxidation for the N-type dopant impurity diffused region 203 to form the gate insulating film 206, a partial pressure ratio ($P_{H2O}/P_{H2}$) and a temperature (° K) are selected. Specifically, as shown in FIG. 13, the ratio and the temperature are selected from the range between the characteristic curve A of equilibrium vapor-hydrogen partial pressure characteristics of $GeO_2$ and the characteristic curve B of equilibrium vapor-hydrogen partial pressure characteristics of $SiO_2$. This enables the formation of the gate insulating film 206 made of $SiO_2$ and not containing $GeO_2$. In more detail, suppose that the selective oxidation is to be performed for the surface of the N-type dopant impurity diffused region 203 to form the gate insulating film 206. In this case, the partial pressure ratio ($P_{H2O}/P_{H2}$) is selected from the range of $10^{-1}$ to $10^{-21}$ between the characteristic curve A of equilibrium vapor-hydrogen partial pressure characteristics of $GeO_2$ and the characteristic curve B of equilibrium vapor-hydrogen partial pressure characteristics of $SiO_2$. Concurrently, the temperature (° K) is selected from the range of from 0° K to 2,500° K between the characteristic curve A of equilibrium vapor-hydrogen partial pressure characteristics of $GeO_2$ and the characteristic curve B of equilibrium vapor-hydrogen partial pressure characteristics of $SiO_2$. Thereby, the gate insulating film 206 not containing $GeO_2$ and formed of $SiO_2$ can be formed. The gate insulating film 206 is not limited to the silicon oxide ($SiO_2$) film, but may be any one of other high-k films, i.e., other high dielectric constant films, such as, an oxyniteride film, a tantalum oxide ($TaO_x$) film, a zirconia oxide ($ZrO_x$) film, a hafnium oxide film ($HfO_x$), and films of silicates these elements. These insulating films are formed by selective oxidation.

Figure 18:
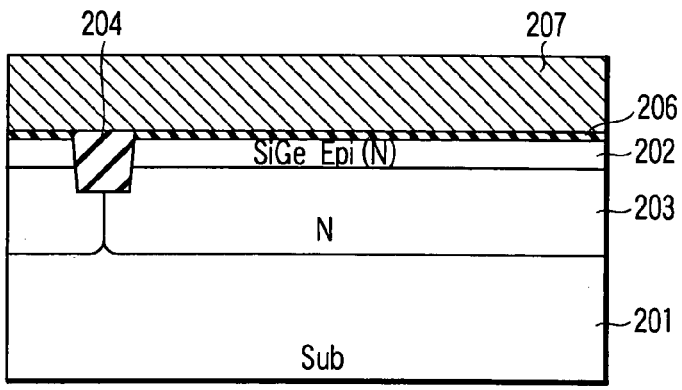
FIG. 18 is a cross sectional view of the p-type MOS field effect transistor in a step following the step of FIG. 17 of the manufacturing method according to the second embodiment of the present invention.

As described above, after the gate insulating film 206 is formed through selective oxidation, a polycrystalline Si film 207 having a thickness of about 150 nm is deposited by a process such as CVD over the overall surface of the silicon semiconductor substrate, specifically, the overall surface of an N-type dopant impurity diffused region 203. Then, the polycrystalline Si film 207 is doped with B, $BF_2$, or the like dopant element (FIG. 18).

Figure 19:
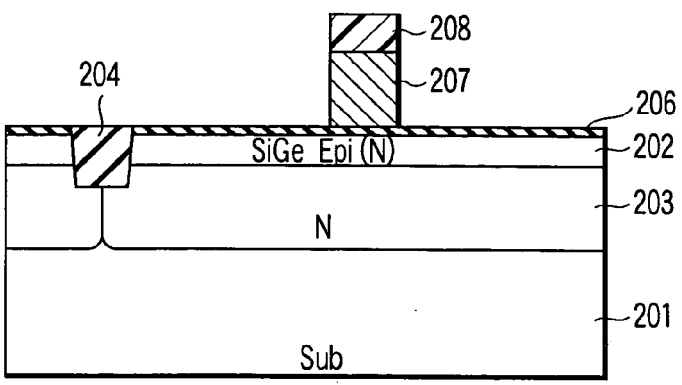
FIG. 19 is a cross sectional view of the p-type MOS field effect transistor in a step following the step of FIG. 18 of the manufacturing method according to the second embodiment of the present invention.

Subsequently, a photoresist 208 is formed by photolithography in a desired region of the surface of the Si film 207, and the Si film 207 is etched using the photoresist 208 as a mask. Thereby, a poly-crystalline Si gate electrode 207 is formed. Subsequently, the photoresist 208 is removed using $H_2O_2$ or $H_2SO_4$. $GeO_2$ is soluble in $H_2O_2$ and $H_2SO_4$. However, since the gate insulating film 206 is formed through the selective oxidation and thus does not contain $GeO_2$, then even with $H_2O_2$ or $H_2SO_4$ being used, no instance occurs in which the gate insulating film 206 becomes solubilized. Consequently, the gate insulating film 206 is maintained in a finely composed state, and hence electrical characteristics are maintained stabilized (FIG. 19).

In comparison, however, as in the conventional case, suppose that the gate insulating film 206 is formed through ordinary thermal oxidation (non-selective oxidation). In this case, the gate insulating film 206 would contain $GeO_2$. Since $GeO_2$ is soluble in $H_2O$ and $H_2SO_4$, the gate insulating film 206 would be formed to be sparsely composed film not satisfying required electrical characteristics.

Figure 20:
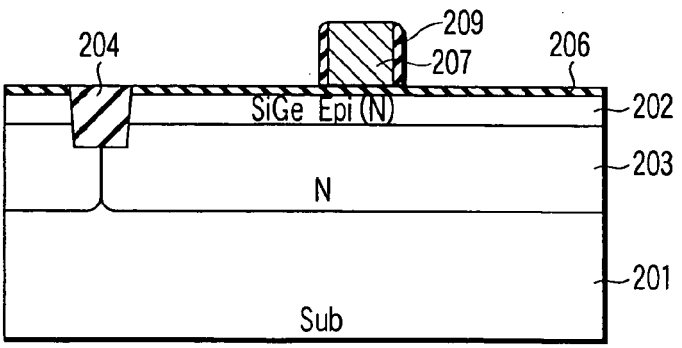
FIG. 20 is a cross sectional view of the p-type MOS field effect transistor in a step following the step of FIG. 19 of the manufacturing method according to the second embodiment of the present invention.

Subsequently, a gate film 209 having a thickness of about 2 nm is formed on the sidewalls of the gate electrode 207 (FIG. 20).

Figure 21:
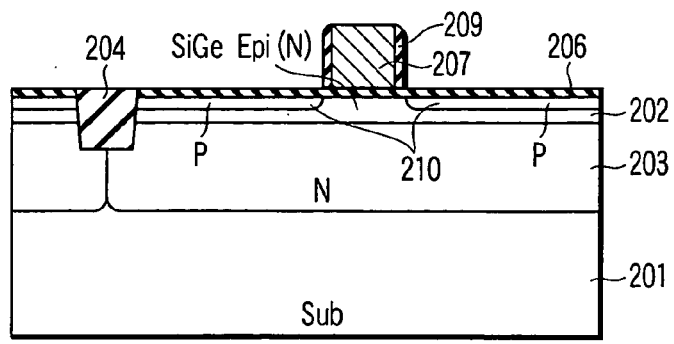
FIG. 21 is a cross sectional view of the p-type MOS field effect transistor in a step following the step of FIG. 20 of the manufacturing method according to the second embodiment of the present invention.

Next, the silicon semiconductor substrate 201 is ion-implanted by using $BF_2$ at an energy of about 1.5 keV and a dose of about 1e15 cm$^{-2}$. Thereby, a shallow P-type dopant impurity diffused region 210 to be used as an LDD (lightly doped drain) region is formed in the surface region of the N-type impurity dopant diffused region 203 (FIG. 21).

Figure 22:
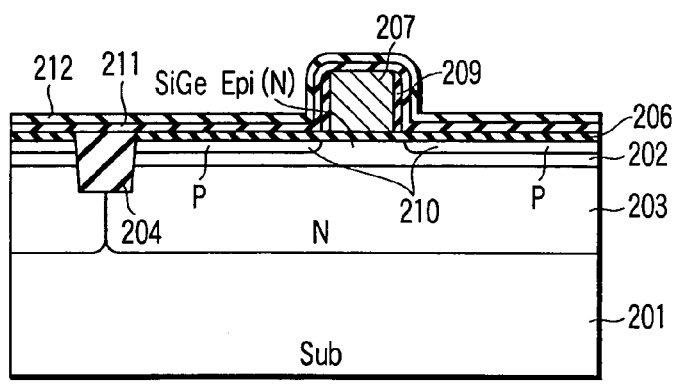
FIG. 22 is a cross sectional view of the p-type MOS field effect transistor in a step following the step of FIG. 21 of the manufacturing method according to the second embodiment of the present invention.

Thereafter, a silicon oxide ($SiO_2$) film 211 having a thickness of about 20 nm is deposited with good coverage to the overall surface of the N-type impurity dopant diffused region 203 including the gate electrode 207, by using CVD (chemical vapor deposition) using TEOS (tetraethoxysilane). Subsequently, a silicon nitride (SiN) film 212 having a thickness of about 20 nm is deposited by CVD with good coverage over the silicon nitride (SiN) film 212 (FIG. 22).

Figure 23:
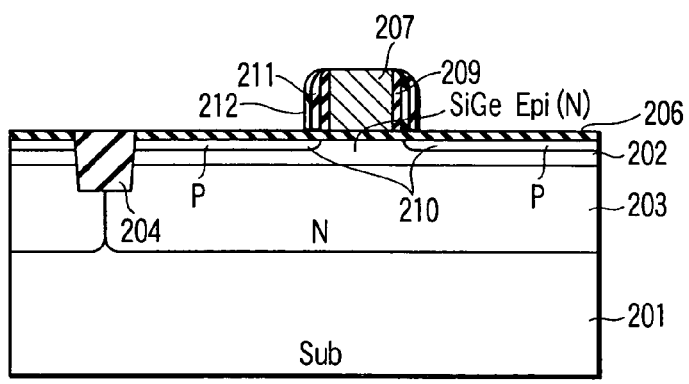
FIG. 23 is a cross sectional view of the p-type MOS field effect transistor in a step following the step of FIG. 22 of the manufacturing method according to the second embodiment of the present invention.

Subsequently, the deposited silicon oxide film 211 and silicon nitride film 212 are anisotropically etched by a process such as RIE (reactive ion etching). In this case, the etching is performed so that the multilayer film of the silicon oxide film 211 and the silicon nitride film 212 remains on the side wall of the gate electrode 207. This consequently enables obtaining a Si gate electrode coated with the oxide film ($SiO_2$ film) 209, the silicon oxide film 211 and the silicon nitride film 212 (FIG. 23).

Figure 24:
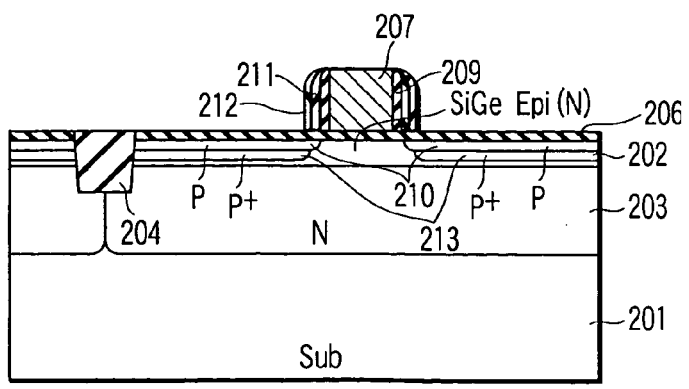
FIG. 24 is a cross sectional view of the p-type MOS field effect transistor in a step following the step of FIG. 23 of the manufacturing method according to the second embodiment of the present invention.
Figure 25:
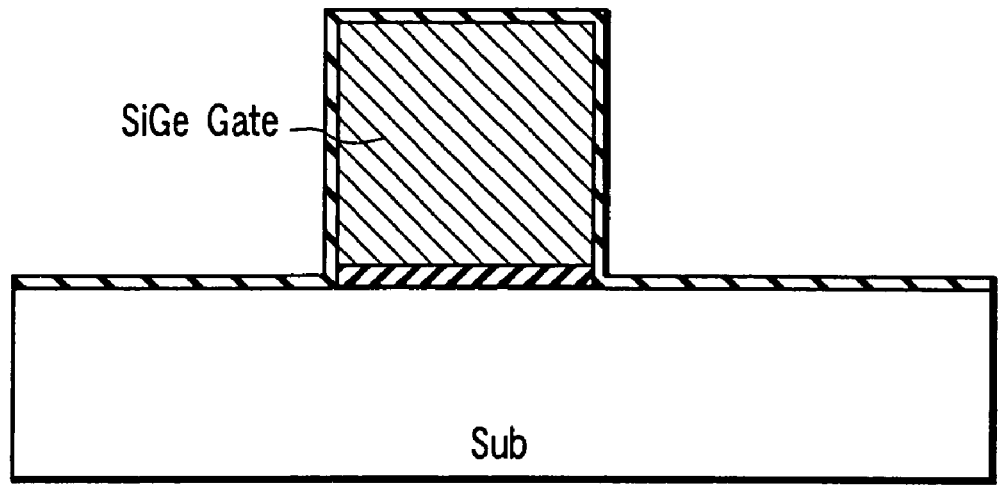
FIG. 25 is a cross sectional view of a MOSFET and is used to explain a SiGe gate electrode and a sidewall oxide film.
Figure 26:
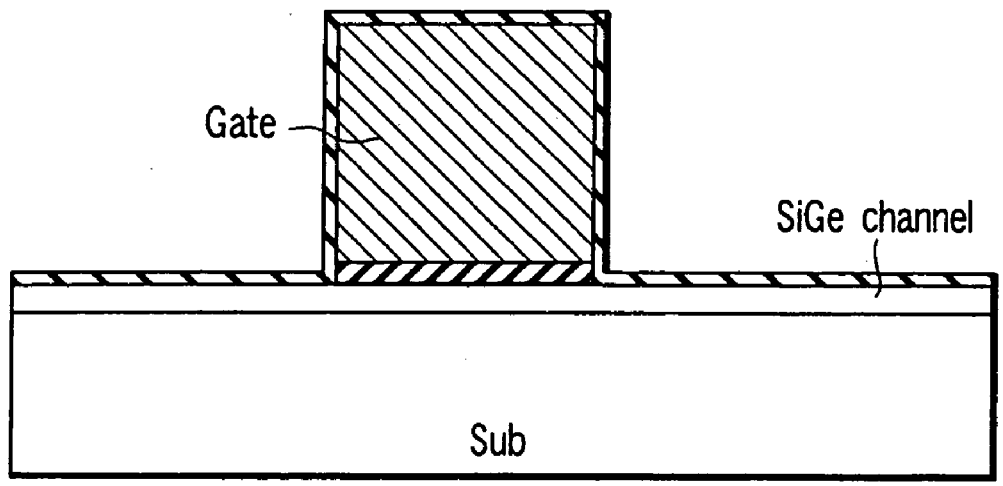
FIG. 26 is a cross-sectional view of a MOSFET and is used to explain a SiGe channel and a gate oxide film.

Subsequently, the substrate thus formed is ion-implanted using B (boron) at an energy of about 5 keV and a dose of about 3e15 cm$^{-2}$. In the ion implantation, the ions are implanted not only into the substrate but also into the gate electrode 207. Subsequently, activation annealing is performed at about 1,050° C. for about 10 seconds in an $N_2$ atmosphere. Thereby, a P-type high concentration dopant impurity diffused region 213 is formed below the shallow P-type dopant impurity diffused region 210. The shallow P-type dopant impurity diffused region 211 and the P-type high concentration dopant impurity diffused region 213 are used to form source/drain regions of the MOS transistor that is to be formed in the N-type impurity dopant diffused region 203 (FIG. 24).

Also in these steps according to the present embodiment, since the gate insulating film 206 is formed, as described above, through selective oxidation, the gate insulating film 206 is maintained to have high heat treatment resistance, hence not permitting damage to be caused by heat treatments. Consequently, even in the case where the gate oxide film is required to be further reduced, the film is maintained in a finely composed state satisfying electrical characteristics required for gate breakdown voltage and the like.

In comparison, however, suppose that the gate insulating film 206 is formed through ordinary thermal oxidation (non-selective oxidation), as in the conventional case. In this case, the gate insulating film 206 is formed to be an $SiO_2$ insulating film containing $GeO_2$, whereby the insulating film 206 is significantly damaged through activation annealing to be in a sparsely composed state. This disables obtaining the required electrical characteristics.

In subsequent steps, contacts, wirings, and the like components are formed using well-known processes to complete the semiconductor device. In these steps, salicides of, for example, Ni or Pt, and/or elevated source/drain regions and the like may be formed.

As described above, according to the first embodiment, the finely composed oxide film not containing the second semiconductor oxide ($GeO_2$) film and made of the first semiconductor oxide ($SiO_2$) film is formed over the conductive film, such as the SiGe film, formed of the first and second semiconductors. In addition, for example, SiGe is selectively oxidized to form the sidewall oxide film not containing $GeO_2$ and made of $SiO_2$, thereby enabling forming the sidewall oxide film that has high heat treatment resistance to processes such as chemical treatment and heat treatments performed after formation of the sidewall oxide film. Consequently, out-diffusion of dopants in the conductive films can be effectively suppressed. Further, for example, SiGe is selectively oxidized to form the gate oxide film not containing $GeO_2$ and made of $SiO_2$, thereby enabling forming the gate oxide film that has high heat treatment resistance to processes such as chemical and heat treatments performed after formation of the gate oxide film.

According to the second embodiment, on the surface of the monocrystal layer made of the at-least two types of semiconductors, the gate insulating film is formed to be in the finely composed state through the selective oxidation in which the first semiconductor is oxidized and the second semiconductor is reduced in the atmosphere containing the reductant and the oxidant as the oxidation seeds for the monocrystal layer. Therefore, the gate insulating film is formed to be the insulating film having high heat treatment resistance to processes such as chemical and heat treatments performed after the formation of the gate insulating film. This consequently enables obtaining desired electrical characteristics, such as high gate dielectric strength. Furthermore, diffusion of dopants from the gate electrode to the channel region can be effectively suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming an insulating film on a semiconductor substrate;
   forming a conductive film made of Si and Ge on the insulating film; and
   thermal-oxidizing the conductive film in an atmosphere that contains an oxidant for oxidizing Si and Ge and a reductant for reducing Si and Ge, to form an oxide film made of Si on the conductive film, wherein a partial pressure ratio of the oxidant to the reductant is larger than a partial pressure ratio of $SiO_2$ under equilibrium and smaller than a partial pressure ratio of $GeO_2$ under equilibrium.

2. The method of manufacturing a semiconductor device, according to claim 1, wherein the oxidant for oxidizing Si is $H_2O$, the reductant for reducing Ge is $H_2$, a temperature in the thermal-oxidizing is in a range of from 0° K to 2,500° K, and the atmosphere has a partial pressure ratio between a characteristic curve of equilibrium vapor-hydrogen partial pressure characteristics of $GeO_2$ and a characteristic curve of equilibrium vapor-hydrogen partial pressure characteristics of $SiO_2$ within a range of a partial pressure ratio ($P_{H2O}/P_{H2}$) of $H_2O$ to $H_2$ in $10^{-1}$ to $10^{-21}$.

3. The method of manufacturing a semiconductor device, according to claim 1, wherein the oxidant for oxidizing Si is at least one of $H_2O$ and $CO_2$, and the reductant for reducing Ge is at least one of $H_2$ and CO.

4. A method of manufacturing a semiconductor device comprising:
   forming source/drain regions formed in a semiconductor substrate;
   forming a gate insulating film on a channel region between the source/drain regions;
   forming a gate electrode made of SiGe on the gate insulating film; and
   thermal-oxidizing the gate electrode in an atmosphere that contains an oxidant for oxidizing Si and Ge and a reductant for reducing Si and Ge to form a sidewall oxide film of Si on a sidewall surface of the gate electrode, wherein a partial pressure ratio of the oxidant to the reductant is larger than a partial pressure ratio of $SiO_2$ under equilibrium and smaller than a partial pressure ratio of $GeO_2$ under equilibrium.

5. The method of manufacturing a semiconductor device, according to claim 4, wherein the oxidant for oxidizing Si is $H_2O$, the reductant for reducing Ge is $H_2$, a temperature in the thermal-oxidizing is in a range of from 0° K to 2,500° K, and the atmosphere has a partial pressure ratio between a characteristic curve of equilibrium vapor-hydrogen partial pressure characteristics of $GeO_2$ and a characteristic curve of equilibrium vapor-hydrogen partial pressure characteristics of $SiO_2$ within a range of a partial pressure ratio ($P_{H2O}/P_{H2}$) of $H_2O$ to $H_2$ in $10^{-1}$ to $10^{-21}$.

6. The method of manufacturing a semiconductor device, according to claim 4, wherein the oxidant for oxidizing Si is at least one of $H_2O$ and $CO_2$, and the reductant for reducing Ge is at least one of $H_2$ and CO.

7. A method of manufacturing a semiconductor device, comprising:
   forming a monocrystal layer made of Si and Ge on a semiconductor substrate; and
   thermal-oxidizing the monocrystal layer in an atmosphere that contains an oxidant for oxidizing Si and Ge and a reductant for reducing Si and Ge to form an oxide film made of one of Si and Ge on a surface of the monocrystal layer, wherein a partial pressure ratio of the oxidant to the reductant is larger than a partial pressure ratio of $SiO_2$ under equilibrium and smaller than a partial pressure ratio of $GeO_2$ under equilibrium.

8. The method of manufacturing a semiconductor device, according to claim 7, wherein the oxidant for oxidizing Si is $H_2O$, the reductant for reducing Ge is $H_2$, the temperature in the thermal-oxidizing is in a range of from 0° K to 2,500° K, and the atmosphere has a partial pressure ratio between a characteristic curve of equilibrium vapor-hydrogen partial pressure characteristics of $GeO_2$ and a characteristic curve of equilibrium vapor-hydrogen partial pressure characteristics of $SiO_2$ within a range of a partial pressure ratio ($P_{H2O}/P_{H2}$) of $H_2O$ to $H_2$ in $10^{-1}$ to $10^{-21}$.

9. The method of manufacturing a semiconductor device, according to claim 7, wherein the oxidant is at least one of $H_2O$ and $CO_2$, and the reductant is at least one of $H_2$ and CO.

10. A method of manufacturing a semiconductor device comprising:
forming an SiGe monocrystal layer including a channel region on a semiconductor substrate;
forming source/drain regions in the SiGe monocrystal layer formed on the semiconductor substrate;
forming a gate insulating film on the channel region between the source/drain regions; and
forming a gate electrode on the gate insulating film,
wherein the gate insulating film is formed on a surface of the SiGe monocrystal layer by thermal-oxidizing the SiGe monocrystal layer in an atmosphere that contains an oxidant for oxidizing Si and Ge, and a reductant for reducing Si and Ge, and the gate insulating film is made of substantially oxide of Si of the SiGe monocrystal layer, wherein a partial pressure ratio of the oxidant to the reductant is larger than a partial pressure ratio of $SiO_2$ under equilibrium and smaller than a partial pressure ratio of $GeO_2$ under equilibrium.

11. The method of manufacturing a semiconductor device, according to claim 10, wherein the oxidant for oxidizing Si is $H_2O$, the reductant for reducing Ge is $H_2$, a temperature in the thermal-oxidizing is in a range of from 0° K to 2,500° K, and the atmosphere has a partial pressure ratio between a characteristic curve of equilibrium vapor-hydrogen partial pressure characteristics of $GeO_2$ and a characteristic curve of equilibrium vapor-hydrogen partial pressure characteristics of $SiO_2$ within a range of a partial pressure ratio ($P_{H2O}/P_{H2}$) of $H_2O$ to $H_2$ in $10^{-1}$ to $10^{-21}$.

12. The method of manufacturing a semiconductor device, according to claim 10, wherein the oxidant for oxidizing Si is at least one of $H_2O$ and $CO_2$, and the reductant for reducing Ge is at least one of $H_2$ and CO.

* * * * *